(12) United States Patent
Takahashi

(10) Patent No.: US 7,643,367 B2
(45) Date of Patent: Jan. 5, 2010

(54) SEMICONDUCTOR MEMORY DEVICE

(75) Inventor: Takeo Takahashi, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 118 days.

(21) Appl. No.: 11/889,714

(22) Filed: Aug. 15, 2007

(65) Prior Publication Data
US 2009/0046494 A1  Feb. 19, 2009

(51) Int. Cl.
*G11C 5/14* (2006.01)
(52) U.S. Cl. .............. 365/227; 365/189.09; 365/185.02; 365/203; 365/204; 365/185.11
(58) Field of Classification Search ................. 365/227, 365/189.09, 185.02, 203, 204, 185.11
See application file for complete search history.

(56) References Cited

U.S. PATENT DOCUMENTS

| | | | | |
|---|---|---|---|---|
| 5,812,440 A * | 9/1998 | Suminaga et al. ............. | 365/51 |
| 5,818,761 A * | 10/1998 | Onakado et al. ....... | 365/185.18 |
| 5,886,937 A * | 3/1999 | Jang ........................... | 365/203 |
| 5,969,990 A * | 10/1999 | Arase .................... | 365/185.25 |
| 6,028,813 A * | 2/2000 | Choi ..................... | 365/230.04 |
| 6,363,027 B1 * | 3/2002 | Komatsu ............... | 365/230.03 |
| 6,480,418 B2 * | 11/2002 | Tanaka et al. .......... | 365/185.13 |
| 6,480,425 B2 * | 11/2002 | Yanagisawa et al. ... | 365/189.05 |
| 6,867,995 B2 * | 3/2005 | Lee et al. ...................... | 365/94 |
| 6,950,360 B2 * | 9/2005 | Nishida et al. .............. | 365/203 |
| 7,027,317 B2 * | 4/2006 | Campardo et al. .......... | 365/150 |
| 7,099,206 B2 * | 8/2006 | Dawson et al. .............. | 365/190 |
| 7,190,615 B2 * | 3/2007 | Fujito et al. ............ | 365/185.05 |
| 7,239,565 B2 * | 7/2007 | Liu ............................ | 365/203 |
| 7,242,624 B2 * | 7/2007 | Kolla et al. ............ | 365/189.08 |
| 7,263,002 B2 * | 8/2007 | Omoto .................. | 365/185.25 |
| 7,376,019 B2 * | 5/2008 | Hashimoto et al. ..... | 365/185.28 |

FOREIGN PATENT DOCUMENTS

JP  2000-090685  3/2000

* cited by examiner

*Primary Examiner*—Viet Q Nguyen
(74) *Attorney, Agent, or Firm*—Studebaker & Brackett PC; Donald R. Studebaker

(57) ABSTRACT

Disclosed herein is a semiconductor memory device which prevents the voltage of a select bit line from being reduced due to the action of coupling capacitance between the select bit line and a non-select bit line, reduces current consumption, and enables high speed reading of bit lines. The semiconductor memory device includes a plurality of memory banks, a plurality of second bit lines, a plurality of selector circuits, a voltage supply circuit. Each of the memory banks includes a plurality of first bit lines, a plurality of word lines, and a plurality of memory banks which are installed between the first bit lines and the word lines. The voltage supply circuit holds non-select bit lines of the first bit lines at the GND level at all times.

5 Claims, 8 Drawing Sheets

SEMICONDUCTOR MEMORY DEVICE

BACKGROUND OF THE INVENTION

1. Field of the Invention

The present invention relates to a semiconductor memory device, such as a mask read only memory (ROM).

2. Description of Related Art

Known as a semiconductor memory device is, for example, a mask ROM. The mask ROM is a read only semiconductor memory device in which values to be stored are written in memory cells in a manufacturing process.

A read circuit of a conventional mask ROM will hereinafter be described with reference to FIG. 1.

A memory cell array 100 includes a plurality of memory cell transistors T11 to Tmn. The memory cell transistors T11 to Tmn have gates connected to word lines WL1 to WLm arranged in rows. The memory cell transistors T11 to Tmn also have drains connected to bit lines BL1 to BLn arranged in columns.

Some of the memory cell transistors T11 to Tmn have sources connected to a first voltage line which is at a ground voltage level (GND level), namely, grounded. The other memory cell transistors have sources which are in a floating state. In FIG. 1, the sources of the memory cell transistors T12, T1n, T21, Tm1 and Tmn are at the GND level, and the sources of the memory cell transistors T11, T22, T2n and Tm2 are in the floating state (denoted by a character F in this figure). Values to be stored are written according to the connection states of the sources of the corresponding memory cell transistors, namely, according to whether those sources are grounded or float.

For example, voltages to be read (also referred to hereinafter as "read voltages") from the memory cell transistors T11 to Tmn may be set to a low level by grounding the sources of the memory cell transistors T11 to Tmn. On the contrary, the read voltages of the memory cell transistors T11 to Tmn may be set to a high level by allowing the sources of the memory cell transistors T11 to Tmn to float.

Selector circuits 110-1 to 110-n and precharge circuits 130-1 to 130-n are connected to the bit lines BL1 to BLn, respectively.

The selector circuits 110-1 to 110-n are composed of, for example, pMOS transistors (shortly referred to hereinafter as "pMOSs") 122-1 to 122-n, respectively. The pMOSs 122-1 to 122-n have sources connected respectively to the bit lines BL1 to BLn and drains connected in common to a data line DL. When select signals (denoted by arrows S1-1 to S1-n in this figure) inputted respectively to the gates of the pMOSs 122-1 to 122-n are low in level, the pMOSs 122-1 to 122-n are turned on to electrically connect the bit lines BL1 to BLn with the data line DL, respectively. On the contrary, when the select signals S1-1 to S1-n are high in level, the pMOSs 122-1 to 122-n are turned off to electrically isolate the bit lines BL1 to BLn from the data line DL, respectively. In the following description, it is assumed that the selector circuits 110-1 to 110-n are turned on when the pMOSs 122-1 to 122-n thereof are turned on, and off when the pMOSs 122-1 to 122-n are turned off.

The precharge circuits 130-1 to 130-n include, for example, pMOSs 142-1 to 142-n and inverting circuits 144-1 to 144-n, respectively. The pMOSs 142-1 to 142-n have sources connected in common to a second voltage line which is at a supply voltage level (VDD level), and drains connected respectively to the bit lines BL1 to BLn. The select signals S1-1 to S1-n are inverted by the inverting circuits 144-1 to 144-n and then inputted to the gates of the pMOSs 142-1 to 142-n, respectively. As a result, when the select signals S1-1 to S1-n are high in level, the pMOSs 142-1 to 142-n are turned on to apply the supply voltage VDD to the bit lines BL1 to BLn, respectively, thereby causing the bit lines BL1 to BLn to assume the VDD level, or high level. On the other hand, when the select signals S1-1 to S1-n are low in level, the pMOSs 142-1 to 142-n are turned off. In the following description, it is assumed that the precharge circuits 130-1 to 130-n are turned on when the pMOSs 142-1 to 142-n thereof are turned on, and off when the pMOSs 142-1 to 142-n are turned off.

A read operation of the conventional mask ROM with the above-mentioned configuration will hereinafter be described with reference to FIGS. 2A to 2D.

In the initial state of every read cycle, all the select signals S1-1 to S1-n are set to a high level. At this time, the selector circuits 110-1 to 110-n are turned off, whereas the precharge circuits 130-1 to 130-n are turned on, so the bit lines BL1 to BLn assume the VDD level. Also, the word lines WL1 to WLm are set to the GND level, thereby causing all the memory cell transistors T11 to Tmn to be turned off.

A description will hereinafter be given of the case of reading a stored value of the memory cell transistor T11 set to a high-level read mode. For reading of the memory cell transistor T11, the bit line BL1 and the word line WL1 are selected.

When the bit line BL1 is selected, at a time t11, the select signal S1-1 becomes low in level and the other select signals S1-2 to S1-n are held at a high level. At this time, the precharge circuit 130-1 is turned off and the selector circuit 110-1 is turned on. As a result, the selected bit line (also referred to hereinafter as a "select bit line") BL1 and the data line DL are electrically connected with each other, so as to have the same voltage level.

When the word line WL1 is selected, at a time t12, the selected word line WL1 is set to the VDD level, which is the level of a drive voltage of the memory cell transistor, and the other word lines WL2 to WLm are set to the GND level. If the word line WL1 becomes high in level, all the memory cell transistors T11 to T1n connected to the word line WL1 are turned on. In contrast, all the memory cell transistors T21 to Tmn connected to the other word lines WL2 to WLm remain off. Because the source of the memory cell transistor T11 is in the floating state, the bit line BL1 remains high in level although the memory cell transistor T11 is turned on. Accordingly, in a read period from the time t12 until a time t13, the voltage of the data line DL is VDD, so as to be outputted as a high-level signal (see FIG. 2A).

Next, a description will be given of the case of reading a stored value of the memory cell transistor T21 set to a low-level read mode. For reading of the memory cell transistor T21, the bit line BL1 and the word line WL2 are selected.

When the bit line BL1 is selected, at the time t11, the select signal S1-1 becomes low in level and the other select signals S1-2 to S1-n are held at a high level. At this time, the precharge circuit 130-1 is turned off and the selector circuit 110-1 is turned on. As a result, the selected bit line BL1 and the data line DL are electrically connected with each other, so as to have the same voltage level.

When the word line WL2 is selected, at the time t12, the selected word line WL2 is set to the VDD level and the other word lines WL1 and WL3 to WLm are set to the GND level. If the voltage of the word line WL2 is VDD, all the memory cell transistors T21 to T2n connected to the word line WL2 are turned on. In contrast, all the memory cell transistors T11 to T1n and T31 to Tmn connected to the other word lines WL1 and WL3 to WLm remain off. Because the source of the memory cell transistor T21 is grounded, the voltage of the bit line BL1 gradually falls due to through-current between the source and drain of the memory cell transistor T21 if the memory cell transistor T21 is turned on. As a result, in the read period from the time t12 until the time t13, the voltage of the data line DL, electrically connected with the bit line BL1, also gradually falls, so it is outputted as a low-level signal (see FIG. 2B).

Meanwhile, because the memory cell transistor T12 connected to the bit line (also referred to hereinafter as a "non-select bit line") BL2, not selected when the memory cell transistor T11 is read, is turned on, through-current flows between the source and drain of the memory cell transistor T12, thereby causing charges stored on the bit line BL2 to be discharged to the first voltage line. At this time, since the select signal S1-2 is high in level, the precharge circuit 130-2 is turned on so as to supply current to the bit line BL2. As a result, the voltage of the bit line BL2 is stabilized at a value slightly lower than VDD (see FIG. 2C).

Also, when the memory cell transistor T21 is read, the bit line BL2 is held at VDD because the source of the memory cell transistor T22 is in the floating state although the memory cell transistor T22 is turned on (see FIG. 2D). As aforementioned, in the read circuit of the conventional mask ROM, a non-select bit line is supplied with current by a corresponding precharge circuit, so that it is held at VDD or a value slightly lower than VDD, thereby making it possible to prevent the voltage of a select bit line from being reduced.

For example, when the memory cell transistor T11 is read, the memory cell transistor T12 is in its on state. For this reason, provided that no current is supplied to the bit line BL2 because the corresponding precharge circuit 130-2 is not provided, the voltage of the bit line BL2 will be reduced due to through-current between the source and drain of the memory cell transistor T12.

If the voltage of the bit line BL2 is reduced, the voltage of the bit line BL1 may be reduced by the action of coupling capacitance between the bit line BL1 and the bit line BL2. This reduction in the voltage of the bit line BL1 may result in misreading of the voltage of the bit line BL1, namely, the stored value of the memory cell transistor T11.

For this reason, the read circuit of the mask ROM holds the voltages of non-select bit lines at VDD or a value slightly lower than VDD using the precharge circuits 130-1 to 130-n.

An example of the ROM read circuit is disclosed in Japanese Unexamined Patent Publication No. 2000-90685 (Patent Document 1).

However, in the above-mentioned conventional mask ROM read circuit, power consumption is increased because precharge circuits need to supply non-select bit lines with current during a reading period in order to prevent the voltage of the non-select bit lines from being reduced. Particularly, when there are a large number of bit lines, a big problem occurs in peak current in that through-currents flow through all memory cell transistors of the low-level read mode connected to a selected word line.

In addition, in large scale ROM, capacitance of bit lines becomes larger because length of bit lines becomes longer. Therefore, transition duration of bit lines during reading will increase. In other words, there is a problem that duration of reading bit lines becomes longer and reading speed of bit lines becomes slower.

SUMMARY OF THE INVENTION

Therefore, the present invention has been made in view of the above problems, and it is an object of the present invention to provide a semiconductor memory device having a read circuit for preventing the voltage of a select bit line from being reduced due to the action of coupling capacitance between the select bit line and a non-select bit line, reducing current consumption, and enabling high speed reading of bit lines. In accordance with the present invention, the above and other objects can be accomplished by the provision of a semiconductor memory device comprising, a plurality of memory banks, a plurality of second bit lines, a plurality of selector circuits, and a voltage supply circuit.

Each of the memory banks includes a plurality of first bit lines, a plurality of word lines, and a plurality of memory banks which are installed between the first bit lines and the word lines.

Each of the second bit lines are connected to the first bit lines in the memory banks respectively.

Each of the selector circuits are provided for the memory banks respectively. Each of the selector circuits electrically connects the first bit lines in the memory bank to the second bit lines responding to a selector signal.

The voltage supply circuit holds non-select bit lines of the first bit lines at the GND level at all times.

The semiconductor memory device of the present invention comprises the voltage supply circuit and the memory banks.

According to the voltage supply circuit, non-select bit lines of the first bit lines can be held at the GND level at all times, and changes of the voltage level of the non-select bit lines can be eliminated. Since the non-select bit lines remain at the GND level, not changed, a select bit line is not subject to a voltage reduction resulting from the action of coupling capacitance between the select bit line and the non-select bit lines. Therefore, there is no need to supply non-select bit lines with current during reading period, and current consumption of non select bit lines during reading period can be reduced.

According to the memory banks, the length of respective bit lines can be shortened. Therefore, it is possible to reduce capacitance of bit lines and achieve high speed reading of bit lines.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
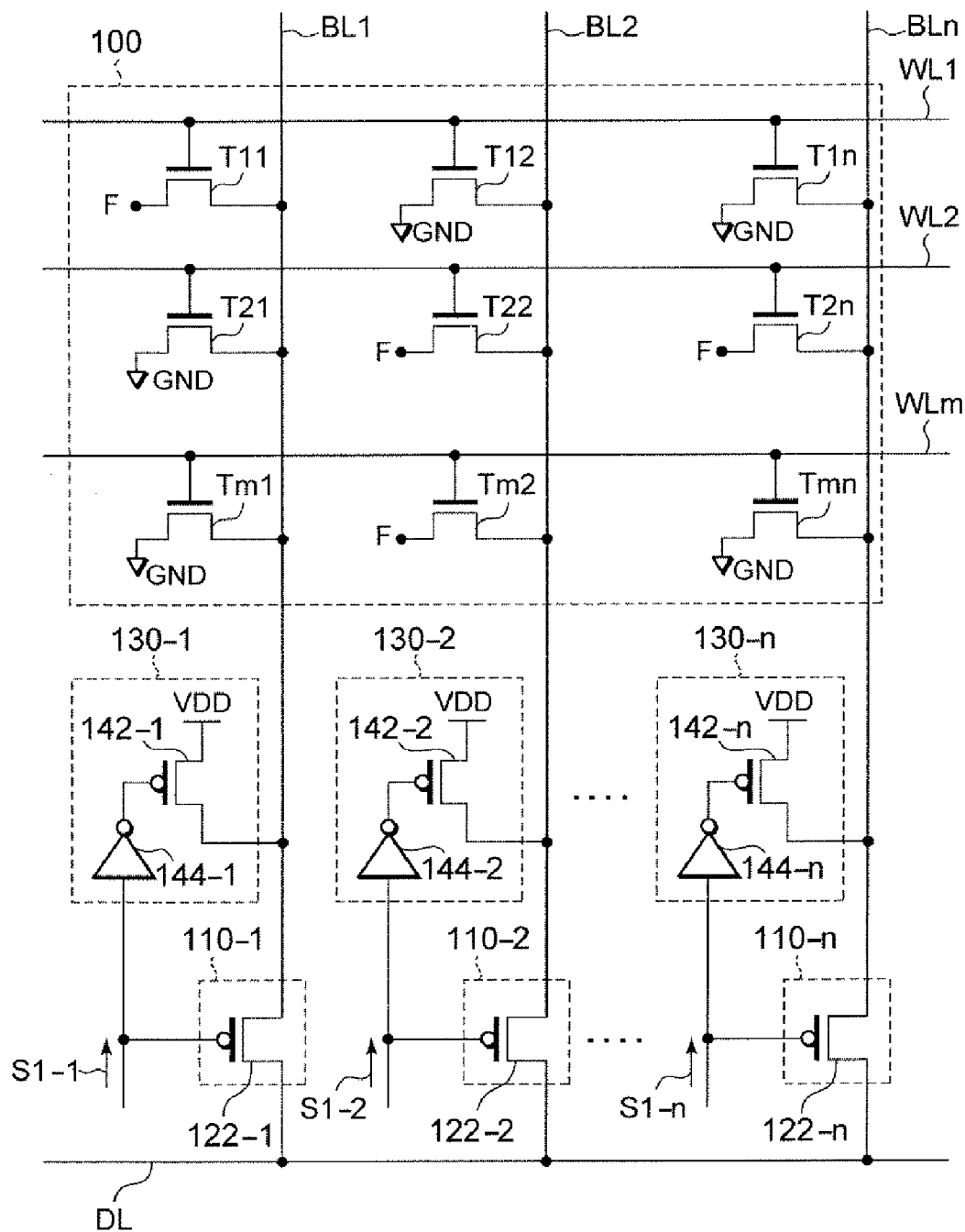
FIG. 1 is a circuit diagram schematically showing the configuration of a conventional semiconductor memory device.
Figure 2A:
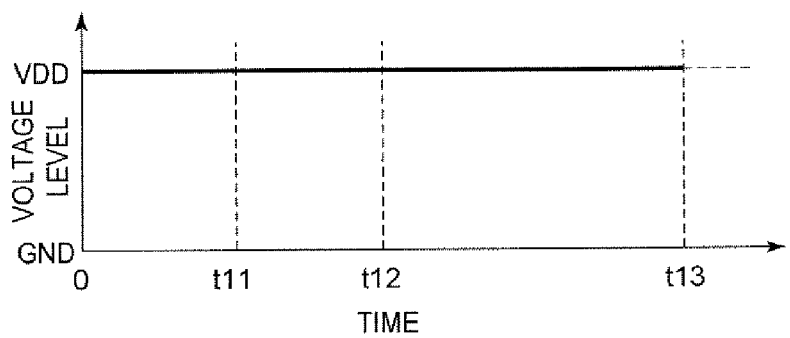
FIGS. 2A to 2D are views illustrating the operation of the conventional semiconductor memory device.
Figure 2B:
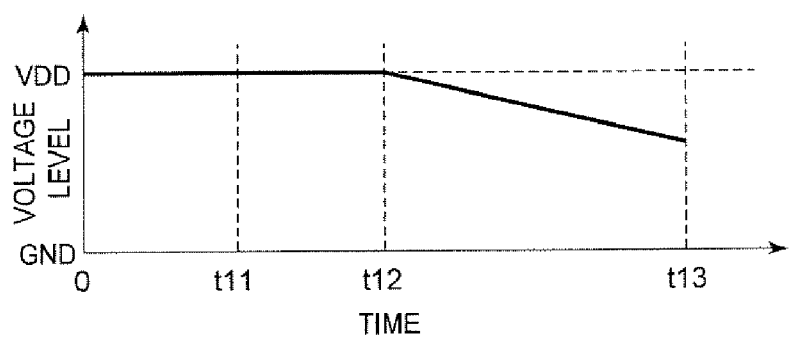
Figure 2C:
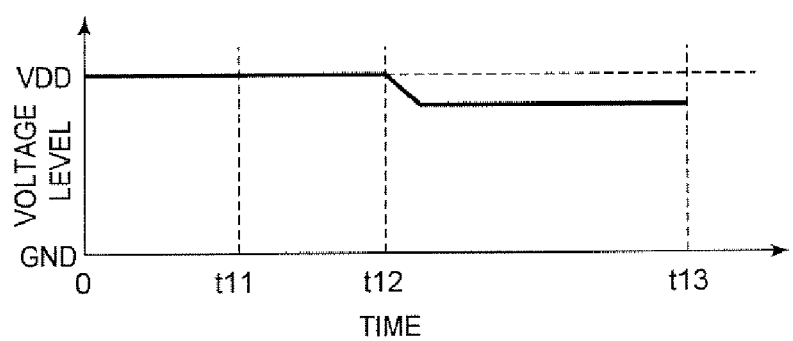
Figure 2D:
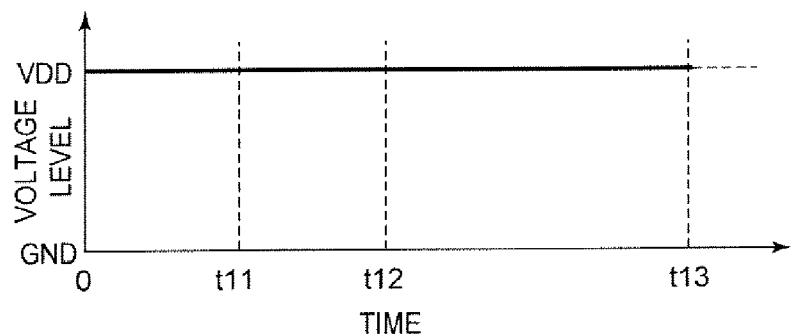

Reference will now be made in detail to the preferred embodiments of the present invention, examples of which are illustrated in the accompanying drawings, wherein like reference numerals refer to like elements throughout and the structures and arrangements of respective constituent elements are shown so schematically that those skilled in the art can understand the present invention. The embodiments are described below to explain the present invention by referring to the figures. These embodiments are nothing but preferred examples, and the present invention is not limited thereto.

Configuration of First Preferred Embodiment

Figure 3:
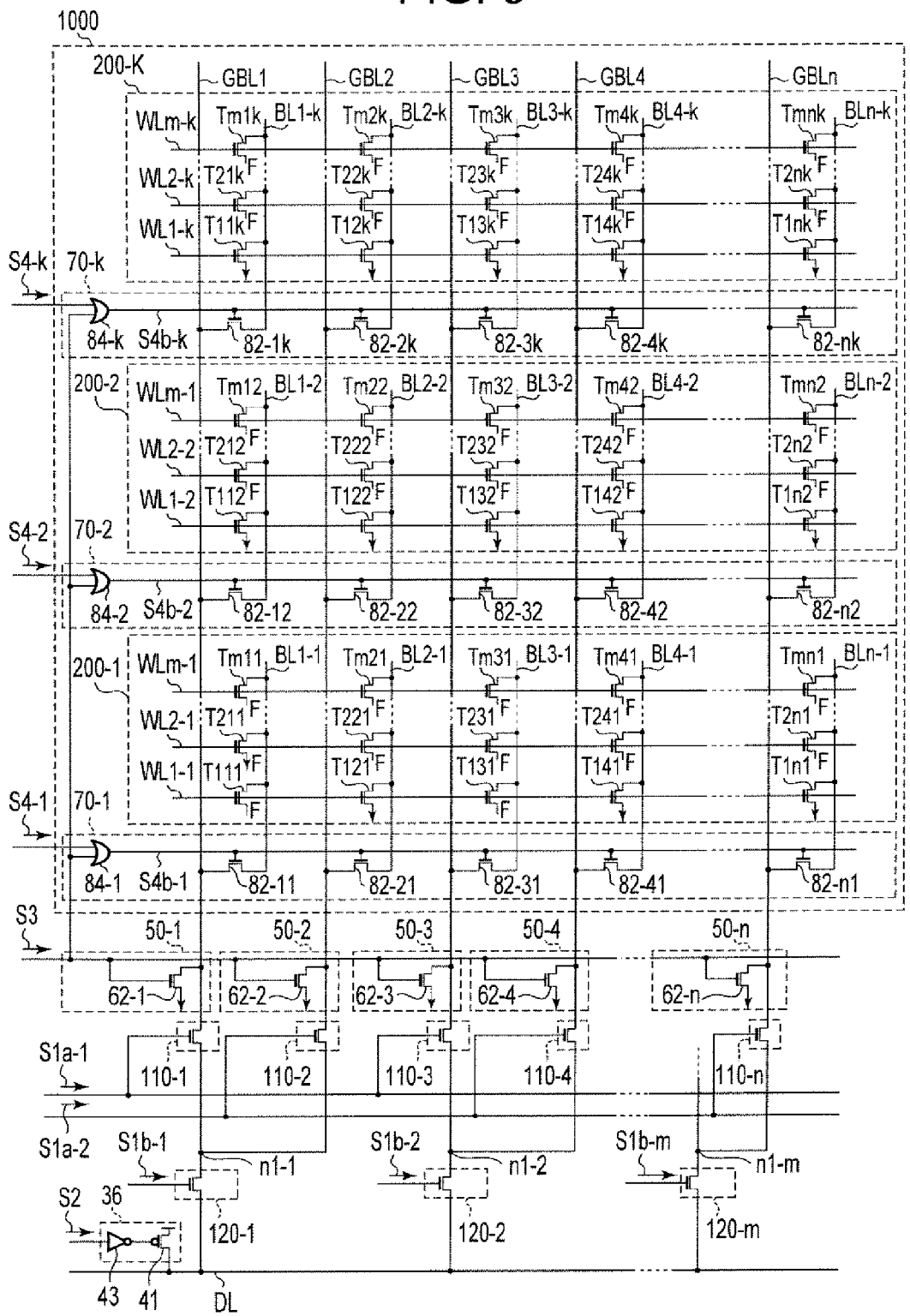
FIG. 3 is a circuit diagram schematically showing the configuration of a mask ROM, which is a semiconductor memory device according to a first preferred embodiment of the present invention.

FIG. 3 is a circuit diagram schematically showing the configuration of a mask ROM, which is a semiconductor memory device according to a first preferred embodiment of the present invention.

The mask ROM comprises a memory cell array 1000, n pull-down circuits 50-1 to 50-n, n/2 first selector circuits 110-1, 110-3, . . . , n/2 second selector circuits 110-2, 110-4, . . . to 110-n, m third selector circuits 120-1 to 120-m, and a precharge circuit 36. Here, m and n are natural numbers which are greater than or equal to 2. Incidentally, the pull-down circuits 50-1 to 50-n can also be referred to as a voltage supply circuit in the present invention.

The memory cell array 1000 includes k memory banks 200-1 to 200-k and k bank selector circuits 70-1 to 70-k. Each of the memory banks 200-1 to 200-k includes m memory cell transistors in row direction and n memory cell transistors in column direction. Here, k is natural numbers which are greater than or equal to 2. In the present embodiment, n channel type MOS transistors (also referred to hereinafter as "nMOSs") are used as the memory cell transistors T11 to Tmnk.

The control electrodes, or the gates, of the memory cell transistors T111 to Tmnk are connected to the word lines WL1-1 to WLm-k installed in row direction. The second main electrodes, or the drains, of the memory cell transistors T111 to Tmnk are connected to the bit lines BL1-1 to BLn-k installed in column direction in the respective memory banks 200-1 to 200-k. Incidentally, the bit lines BL1-1 to BLn-k can also be referred to as a first bit lines in the present invention.

The first main electrodes, or the sources, of some of the memory cell transistors T111 to Tmnk are connected to the first voltage line of the GND level, namely, they are grounded (denoted by a downward arrow in this figure). The sources of the other memory cell transistors T111 to Tmnk are not connected to the first voltage line, namely, they are in a floating state (denoted by a character F in this figure). Therefore, values to be stored are written in the memory cell transistors T111 to Tmnk according to the connection status of whether the source is grounded or in a floating state.

Concretely, read voltages from the memory cell transistors T111 to Tmnk may be set to a low level by grounding the sources of the memory cell transistors T111 to Tmnk. On the contrary, the read voltages of the memory cell transistors T111 to Tmnk may be set to a high level by allowing the sources of the memory cell transistors T11a to Tmnk to float.

Each of the bank selector circuits 70-1 to 70-k comprises OR circuits 84-1 to 84-k and nMOSs 82-11 to 82-nk. Each of the OR circuits 84-1 to 84-k is installed in the respective memory banks 200-1 to 200-k. Each of the nMOSs 82-11 to 82-nk is disposed between the respective bit lines BL1-1 to BLn-k and global bit lines GBL1 to GBLn. Incidentally, the global bit lines GBL1 to GBLn can also be referred to as a second bit lines in the present invention.

Each of the OR circuits 84-1 to 84-k is adapted to receive one of bank selector signals S4-1 to S4-k and an input signal S3. The bank selector signals S4-1 to S4-k have two voltage levels consisting of a high level as a select level and a low level as a non-select level. The input signal S3 has two voltage levels consisting of a high level as an active level and a low level as an inactive level. The gates of nMOSs 82-11 to 82-nk are adapted to receive one of outputs S4b-1 to S4b-n of OR circuits 84-1 to 84-k.

When one of the bank selector signals S4-1 to S4-k assumes the select level, the respective bit lines BL1-1 to BLn-k in the memory bank to which the bank selector signal is inputted are electrically connected to the corresponding global bit lines GBL1 to GBLn. On the other hand, when one of the bank selector signals S4-1 to S4-k assumes the non select level and the input signal S3 does not assume the active level, the respective bit lines BL1-1 to BLn-k in the corresponding memory bank are electrically isolated to the corresponding global bit lines GBL1 to GBLn.

When the input signal S3 assumes the active level, the respective bit lines BL1-1 to BLn-k in all the memory banks are electrically connected to the corresponding global bit lines. On the other hand, when the input signal S3 assumes the inactive level and all the bank selector signals S4-1 to S4-k does not assume the active level, the respective bit lines BL1-1 to BLn-k in all the memory banks are electrically isolated to the corresponding global bit lines.

The memory bank including the bit lines which are electrically connected to the global bit line is referred to as a "select bank". The memory bank including the bit lines which are electrically isolated to the global bit line is referred to as a "non-select bank".

The first selector circuits 110-1, 110-3, . . . , the second selector circuits 110-2, 1110-4, to 110-n, the third selector circuits 120-1 to 120-m, and the pull-down circuits 50-1 to 50-n are connected to the global bit lines GBL1 to GBLn.

The first selector circuit 110-1 is located between the global bit line GBL1 and a node n1-1. The second selector circuit 110-2 is located between the global bit line GBL2 adjacent to the global bit line GBL1 and the node n1-1. The node n1-I is commonly connected to the first selector circuit 110-1 and the second selector circuit 110-2. The third selector circuit 120-1 is located between the node n1-1 and a data line DL. Namely, because the first selector circuits 110-1, 110-3, . . . are connected to the respective odd global bit lines GBL1, GBL3 . . . ., and the second selector circuits 110-2, 110-4, . . . 110-n are connected to the respective even global bit lines GBL2, GBL4, . . . GBLn, the number of the first and the second selector circuits 110-1 to 110-n is n in total. On the other hand, because the third selector circuits 120-1 to 120-m are respectively located for the pair of the first and the second selector circuits 110-1 to 110-n adjacent to each other, the number of the third selector circuits 120-1 to 120-m is m (m=n/2) in total.

A first select signal S1a-1 is commonly inputted to the first selector circuits 110-1, 110-3, . . . . . A second select signal S1a-2 is commonly inputted to the second selector circuits 110-2, 110-4, . . . , 110-n. Third select signals S1b-1 to S1b-m are inputted to the respective third selector circuits 120-1 to 120-m.

As described above, the selector circuit in this embodiment is a two stages configuration comprising a first stage which includes the first and the second selector circuits 110-1 to 110-n and a second stage which includes the third selector circuits 120-1 to 120-m. Accordingly, the number of the select signals can be reduced to m+2 in total, namely, one first select signal, one second select signal, and m third select signals.

Incidentally, although the selector circuits are configured as described above in this embodiment, other configurations are also adoptable as long as it can electrically connect or isolate one of the global bit lines GBL1 to GBLn and the data line DL responding to the voltage level of select signals.

For example, a one stage configuration is adoptable in which selector circuits are located for the respective global bit lines and select signals are inputted to the respective selector circuits. According to this one stage configuration, the configuration of selector circuit could be more simplified although the number of the select signals to be needed amounts to the number of the global bit lines, namely n.

For example, a configuration of more than three stages is also adoptable. This configuration provides a greater reduction of the selector signals although the configuration of the selector circuits becomes more complicated.

The precharge circuit 36 is connected to the data line DL.

The precharge circuit 36 comprises a pMOS 41 and an inverter circuit 43. An inverted signal of an input signal S2 is inputted to the gate of the pMOS 41. The source of the pMOS 41 is connected to a VDD. The drain of the pMOS 41 is connected to the data line DL. The precharge circuit 36 is adapted to receive the input signal S2 having two voltage levels consisting of a high level as an active level and a low level as an inactive level. The precharge circuit 36 is able to precharge the voltage of the global bit lines GBL1 to GBLn connected to the data line DL(namely, precharge the global bit lines GBL1 to GBLn to a predetermined voltage level).

Incidentally, although only one precharge circuit is used as described above in this embodiment, it is possible to configure by using a plurality of precharge circuits. In this configuration, precharge circuits are respectively connected to the respective global bit lines GBL1 to GBLn.

Each of the pull-down circuits 50-1 to 50-n is connected the respective global bit lines GBL1 to GBLn in one-on-one relationship. nMOSs 62-1 to 62-n are used as the pull-down circuits 50-1 to 50-n. The input signal S3 is inputted to the gates of the pull-down circuits 50-1 to 50-n. That is, the input signal S3 is commonly inputted to both the bank selector circuits 70-1 to 70-k and the pull-down circuits 50-1 to 50-n. The sources of the nMOSs 62-1 to 62-n are grounded. On the other hand, the drains of the nMOSs 62-1 to 62-n are connected to the respective global bit lines GBL1 to GBLn.

Incidentally, although n pull-down circuits are used as described above in this embodiment, it is possible to configure by using only one pull-down circuit. In this configuration, one pull-down circuit is commonly connected to all the global bit lines GBL1 to GBLn.

When the input signal S3 assumes the active level, namely, when the input signal S3 is high in level, the nMOSs 62-1 to 62-n are turned on. When the nMOSs 62-1 to 62-n are turned on, the global bit lines GBL1 to GBLn are pulled down, namely, the voltage level thereof becomes the GND level.

On the other hand, when the input signal S3 assumes the inactive level, namely, when the input signal S3 is low in level, the nMOSs 62-1 to 62-n are turned off.

Incidentally, the input signal S3 is inputted to the OR circuits S4-1 to S4-n of the bank selector circuits 70-1 to 70-k as described above.

Figure 4:
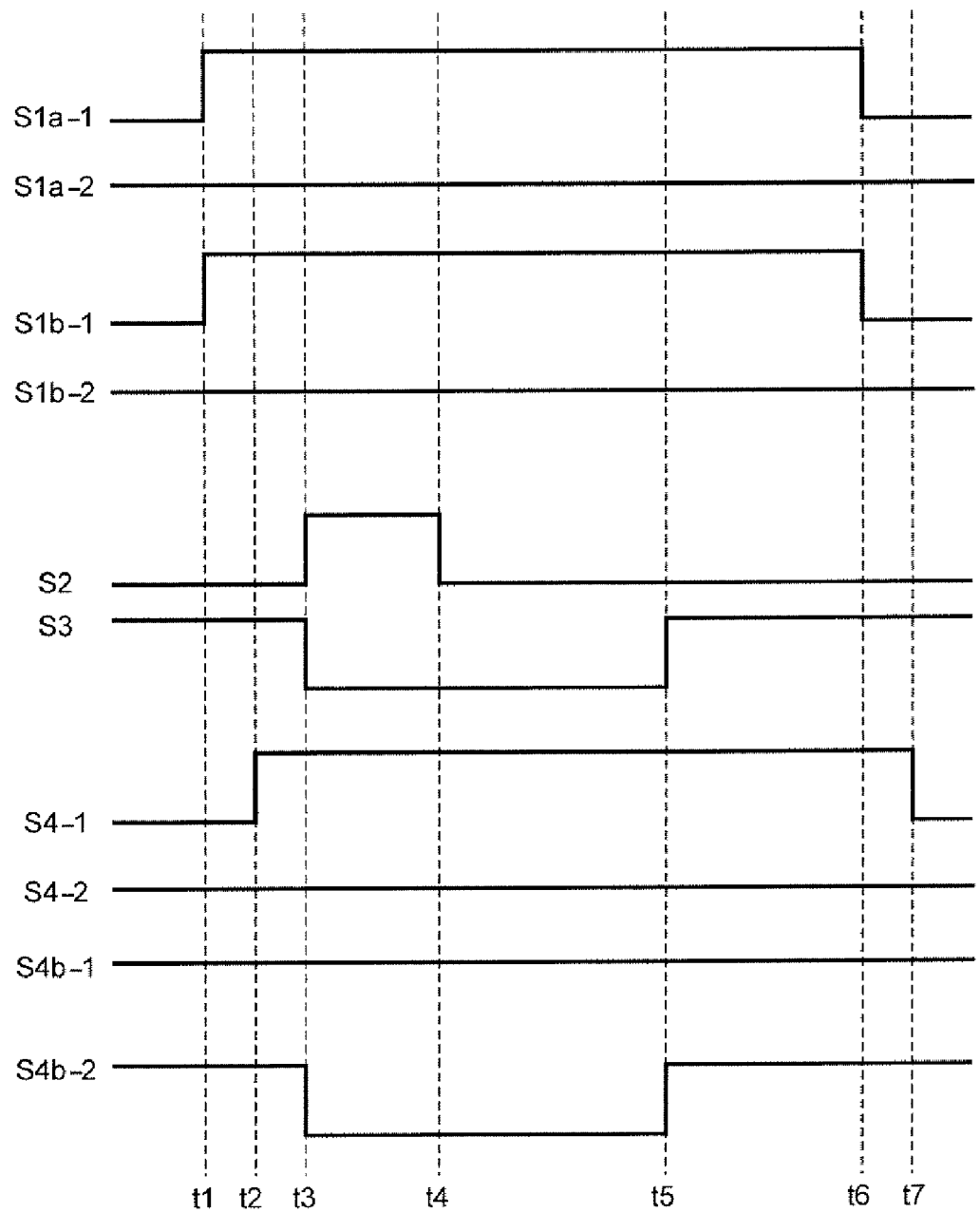
FIG. 4 is a view illustrating the operation of the respective control signal of the semiconductor memory device according to the first preferred embodiment.

The operation of the semiconductor memory device according to the first preferred embodiment will hereinafter be described with reference to FIG. 4 and FIGS. 5A, 5B, 5C and 5D. FIG. 4 illustrates the operations of the respective control signals S1a-1, S1a-2, S1b-1, S1b-2, S2, S3, S4-1, S4-2, S4b-1 and S4b-2 according to the first preferred embodiment. FIGS. 5A, 5B, 5C and 5D illustrate the operation of one of the bit lines. In FIGS. 5A, 5B, 5C and 5D, the abscissa axis represents time and the ordinate axis represents bit line voltage level.

Figure 5A:
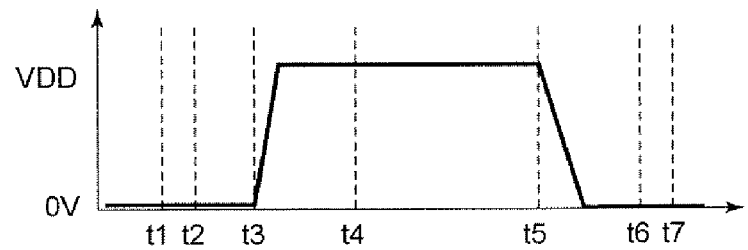
FIGS. 5A to 5D are views illustrating the operation of the bit line of the semiconductor memory device according to the first preferred embodiment.

FIG. 5A illustrates a preferred example of the operation of the bit line BL1-1 in the case of reading the memory cell transistor T111.

In this preferred operation example, it is assumed that the source of the memory cell T111 is in the floating state, namely, the memory cell transistor T111 is set to the high-level read mode.

In the initial state of the read cycle, all the bit lines BL1-1 to BLn-k and all the global bit lines GBL1 to GBLn are set to the GND level. Accordingly, the bit line BL1-1 is also at the GND level. In order to set all the bit lines BL1-1 to BLn-k and all the global bit lines GBL1 to GBLn to the GND level, the input signal S3 is set to the active level. Namely, setting the input signal S3 to the active level causes all the nMOSs 62-1 to nMOSs 62-n which constitute the pull-down circuits 50-1 to 50-n to be turned on. Accordingly, all the global bit lines GBL1 to GBLn become the GND level. Simultaneously, all the outputs S4b-1 to S4b-k of the OR circuits 84-1 to 84-k which constitute the bank selector circuits 70-1 to 70-k become high in level as the select level. Accordingly, all the memory banks 200-1 to 200-k become the select banks, and the respective bit lines BL1-1 to BLn-k of all the memory banks and the global bit lines GBL1 to GBLn are electrically connected. Therefore, all the bit lines BL1-1 to BLn-k become the GND level. Incidentally, all the bank selector signals S4-1 to S4-k are set to be non-select level, and all the word lines WL1-1 to WLm-k is set to be GND level.

At a time t1, the select signal S1a-1 and the select signal S1b-1 are set to the select level, and the select signal S1a-2 and the select signal S1b-2 to S1b-m are set to the non-select level. As a result, the global bit line GBL1 and the data line DL are electrically connected with each other.

At a time t2, the bank selector signal S4-1 is set to the select level, and the other bank selector signals S4-2 to S4-k are set to the non-select level. However, because the input signal S3 remains high in level, all the memory banks 200-1 to 200-k remain the select banks.

Incidentally, with regard to the time in which the select signal S1a-1 and the select signal S1b-1 are set to be the select level and the time in which the bank selector signal S4-1 is set to be the select level, it is both applicable if one of the times is earlier than the other time and if both of the times are at the same time.

At a time t3, the input signal S2 is set to the active level, and the input signal S3 is set to the inactive level. As a result, the precharge circuit 36 which is connected to data line DL is turned on, thereby causing the global bit line GBL1 which is electrically connected to the data line DL to become the VDD level. Because the input signal S3 becomes the non-select level, the memory banks 200-2 to 200-k become the non-select banks, thereby causing the global bit lines GBL1 to GBLn and the bit lines BL1-2 to BLn-k to be electrically isolated with each other. Accordingly, charges flow into the bit line BL1-1 of the select bank 200-1, and the voltage level of the bit line BL1-1 increases to near the VDD level as shown in FIG. 5A. Here, the reason the voltage level of the bit line BL1-1 does not increase to the VDD level is that the bank selector circuits consist of nMOS transistors. The bit lines BL2-1 to BLn-1 which are connected to the non-select global bit lines GBL2 to GBLn of the select bank 200-1, and the bit lines BL1-2 to BLn-k of the non-select bank 200-2 to 200-k, keep the GND level.

Incidentally, the time in which the input signal S3 is set to the inactive level can vary to any time by the time t3 in which the precharge circuit 36 is turned on. Here, the input signal S3 is set to the inactive level at the time t3.

At a time t4 after the global bit line GBL1 becomes the VDD level, the input signal S2 is set to the inactive level. As a result, the precharge circuit 36 is turned off. Similarly, at the time t4, the word line WL1-1 is set to the VDD level, so as to turn on the memory cell transistor T111. At the same time, the memory cell transistors T121 to T1n1 whose gates are connected to the same word line WL1-1 are turned on. In contrast, the memory cell transistors T211 to Tmnk which are connected to the word lines WL2-1 to WLm-k other than the word line WL1-1 remain off.

Even when the memory cell transistor T111 is turned on, the bit line BL1-1 which is connected to the drain of the memory cell transistor T111 is also in a floating state because the source of the memory cell transistor T111 is in a floating state. Namely, the bit line BL1-1 remains near the VDD level (see FIG. 5A). Consequently, the voltage of the global bit line GBL1 is in the high-level read mode and is read via the data line DL electrically connected to the global bit line GBL1.

At a time t5 after the lapse of a read period of the global bit line GBL1, the input signal S3 is set to the active level. As a result, all the nMOSs 62-1 to 62-n which constitute the pull-down circuits 50-1 to 50-n are turned on like the initial state, thereby causing all the global bit lines GBL1 to GBLn to the GND level. Simultaneously, all the outputs S4b-1 to S4b-k of the OR circuits 84-1 to 84-k which constitute the bank selector circuits 70-1 to 70-k become the high level as the select level, thereby causing all the memory banks 200-1 to 200-k to the select banks. Namely, the respective bit lines BL1-1 to BLn-k of all the memory banks and the respective global bit lines GBL1 to GBLn are electrically connected with each other. Consequently, all the bit lines BL1-1 to BLn-k become the GND level. Accordingly, the voltage level of the bit line BL1-1 falls to the GND level as shown in FIG. 5A.

At a time t6 after the voltage level of the global bit line GBL1 become the GND level, the select signals S1a-1 and S1b-1 are set to the non-select level. As a result, the global bit line GBL1 and the data line DL are electrically isolated.

At a time t7, the bank selector signal S4-1 is set to the non-select level. Incidentally, all the memory banks 200-1 to 200-k remains the select banks because the input signal S3 remains the active level. Similarly, at the time t7, the word line WL1-1 is set to the GND level, thereby causing the memory cell transistors T111 to T1n1 whose gates are connected to the word line WL1-1 to turn off. In this manner, it moves to the initial state of the next cycle.

Figure 5B:
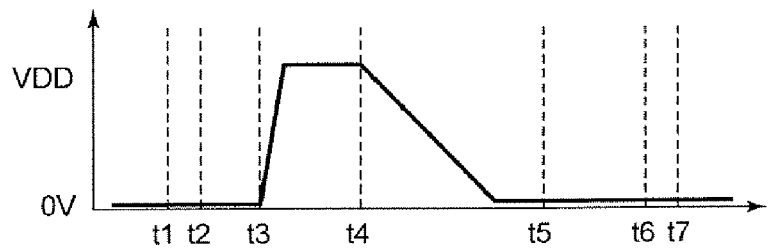

FIG. 5B illustrates a preferred example of the operation of the bit line BL1-1 in the case of reading the memory cell transistor T211.

In this preferred operation example, it is assumed that the source of the memory cell T211 is in the grounded state, namely, the memory cell transistor T211 is set to the low-level read mode.

In the initial state of the read cycle, all the bit lines BL1-1 to BLn-k and all the global bit lines GBL1 to GBLn are set to the GND level. Accordingly, the bit line BL1-1 is also at the GND level.

At the time t1, the select signal S1a-1 and the select signal S1b-1 are set to the select level, and the select signal S1a-2 and the select signal S1b-2 to S1b-m are set to the non-select level. As a result, the global bit line GBL1 and the data line DL are electrically connected with each other.

At the time t2, the bank selector signal S4-1 is set to the select level, and the other bank selector signals S4-2 to S4-k are set to the non-select level. However, because the input signal S3 remains high in level, all the memory banks 200-1 to 200-k remain the select banks.

At the time t3, the input signal S2 is set to the active level, and the input signal S3 is set to the inactive level. As a result, the precharge circuit 36 which is connected to data line DL is turned on, thereby causing the global bit line GBL1 which is electrically connected to the data line DL to become the VDD level. Because the input signal S3 becomes the non-select level, the memory banks 200-2 to 200-k become the non-select banks, thereby causing the global bit lines GBL1 to GBLn and the bit lines BL1-2 to BLn-k to be electrically isolated with each other. Accordingly, charges flow into the bit line BL1-1 of the select bank 200-1, and the voltage level of the bit line BL1-1 increases to near the VDD level as shown in FIG. 5B. Here, the reason the voltage level of the bit line BL1-1 does not increase to the VDD level is that the bank selector circuits consist of NMOS transistors. The bit lines BL2-1 to BLn-1 which are connected to the non-select global bit lines GBL2 to GBLn of the select bank 200-1, and the bit lines BL1-2 to BLn-k of the non-select bank 200-2 to 200-k, keep the GND level.

At the time t4 after the global bit line GBL1 becomes the VDD level, the input signal S2 is set to the inactive level. As a result, the precharge circuit 36 is turned off. Similarly, at the time t4, the word line WL2-1 is set to the VDD level, so as to turn on the memory cell transistor T211. At the same time, the memory cell transistors T221 to T2n1 whose gates are connected to the same word line WL2-1 are turned on. In contrast, the memory cell transistors which are connected to the word lines other than the word line WL2-1 remain off.

When the memory cell transistor T211 is turned on, the voltage level of the bit line BL1-1 falls from near the VDD level because the source of the memory cell transistor T211 is in a grounded state (see FIG. 5B). The voltage level of the global bit line GBL1 falls from the VDD level. Consequently, the voltage of the global bit line GBL1 is in the low-level read mode and is read via the data line DL electrically connected to the global bit line GBL1.

At the time t5 after the lapse of a read period of the global bit line GBL1, the input signal S3 is set to the active level. As a result, all the nMOSs 62-1 to 62-n which constitute the pull-down circuits 50-1 to 50-n are turned on like the initial state, thereby causing all the global bit lines GBL1 to GBLn to the GND level. Simultaneously, all the outputs S4b-1 to S4b-k of the OR circuits 84-1 to 84-k which constitute the bank selector circuits 70-1 to 70-k become the high level as the select level, thereby causing all the memory banks 200-1 to 200-k to the select banks. Namely, the respective bit lines BL1-1 to BLn-k of all the memory banks and the respective global bit lines GBL1 to GBLn are electrically connected with each other. Consequently, all the bit lines BL1-1 to BLn-k become the GND level. Accordingly, the voltage level of the bit line BL1-1 remains the GND level as shown in FIG. 5B.

At the time t6, the select signals S1a-1 and S1b-1 are set to the non-select level.

At the time t7, the bank selector signal S4-1 is set to the non-select level. Similarly, at the time t7, the word line WL2-1 is set to the GND level, thereby causing the memory cell transistors T211 to T2*n*1 whose gates are connected to the word line WL2-1 to turn off. In this manner, it moves to the initial state of the next cycle.

Figure 5C:
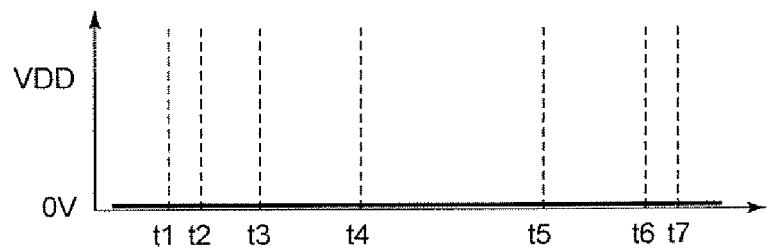

FIG. 5C illustrates the voltage of the non-select bit line in the select bank when the memory cell transistor T111 is read in the above-described read cycle. Here, a description will be given of the bit line BL2-1 as an example.

In the initial state of the read cycle, all the bit lines BL1-1 to BL*n*-k and all the global bit lines GBL1 to GBL*n* are set to the GND level. Accordingly, the bit line BL2-1 is also at the GND level.

At the time t1, the global bit line GBL1 is selected. In contrast, the global bit line GBL2 is not selected because the select signal S1*a*-2 is non-select level. The pull-down circuit 50-2 remains on state. Accordingly, the voltage of the bit line BL2-1 remains at the GND level.

At the time t2, the bank selector signal S4-1 is set to the select level. However, because the input signal S3 is already set to the high level, the global bit line GBL2 and the bit line BL2-1 remain electrically connected with each other. Accordingly, the voltage of the bit line BL2-1 is at the GND level.

At the time t3, the input signal S2 is set to the active level, and the input signal S3 is set to the inactive level. The precharge circuit 36 is turned on because the input signal S2 is set to the active level. However, the global bit line GBL2 and the data line DL are not electrically connected because the input signal S1*a*-2 is at the non-select level. Accordingly, the global bit line GBL2 and the bit line BL2-1 remain at the GND level.

At the time t4, the word line WL1-1 is set to the VDD level, thereby causing the memory cell transistor T121 which is set to the low-level read mode to the on state. However, the voltage level of the bit line BL2-1 remains at the GND level because the voltage of the bit line BL2-1 has already been at the GND level. Similarly, the voltage level of the bit line BL2-1 does not change even if the memory cell transistor T121 is set to the high-level read mode.

At the time t5, the input signal S3 is set to the active level. As a result, all the nMOSs 62-1 to 62-n which constitute the pull-down circuits 50-1 to 50-n are turned on like the initial state, thereby causing all the global bit lines GBL1 to GBL*n* to the GND level. Accordingly, the voltage level of the bit line BL2-1 continues to remain the GND level as shown in FIG. 5C.

Figure 5D:
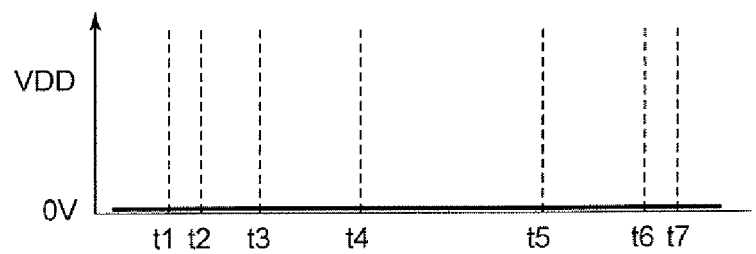

FIG. 5D illustrates the voltage of the non-select bit line in the non-select bank when the memory cell transistor T111 is read in the above-described read cycle. Here, a description will be given of the bit line BL1-2 as an example.

In the initial state of the read cycle, all the bit lines BL1-1 to BL*n*-k and all the global bit lines GBL1 to GBL*n* are set to the GND level. Accordingly, the bit line BL1-2 is also at the GND level.

At the time t1, the global bit line GBL1 is selected. Namely, the global bit line GBL1 and the data line DL are electrically connected with each other.

At the time t2, the bank selector signal S4-1 is set to the select level. However, because the input signal S3 is already set to the high level, the global bit line GBL1 and the bit line BL1-2 remain electrically connected with each other. Accordingly, the voltage of the bit line BL1-2 is at the GND level.

At the time t3, the input signal S2 is set to the active level, and the input signal S3 is set to the inactive level. The precharge circuit 36 is turned on because the input signal S2 is set to the active level. As a result, the global bit line GBL1 becomes the VDD level. However, the bit line BL1-2 is not electrically connected to the global bit line GBL1 because the input signal S3 is at the inactive level and the bank selector signal S4-2 is at the non-select level. Accordingly, the bit line BL1-2 remains at the GND level.

At the time t4, the word line WL1-1 is set to the VDD level, thereby causing the memory cell transistors T111 to T1*n*1 to the on state. However, this does not influence the bit lines in the non-select banks. Accordingly, the bit line BL1-2 remains at the GND level.

At the time t5, the input signal S3 is set to the active level. As a result, all the nMOSs 62-1 to 62-n which constitute the pull-down circuits 50-1 to 50-n are turned on like the initial state, thereby causing all the global bit lines GBL1 to GBL*n* to the GND level. Simultaneously, the global bit line GBL1 and the bit line BL1-2 are electrically connected with each other. Accordingly, the voltage level of the bit line BL1-2 continues to remain the GND level as shown in FIG. 5D.

As stated above, the semiconductor memory device according to the first preferred embodiment comprises the pull-down circuits to set bit lines to the GND level. Accordingly, the non-select global bit lines and bit lines of the non-select banks can be held at the GND level at all times. Since the non-select bit lines remain at the GND level, not changed, a select bit line is not subject to a voltage reduction resulting from the action of coupling capacitance between the select bit line and the non-select bit lines. Therefore, there is no need to supply the non-select bit lines with current during reading period, and current consumption of the non-select bit lines during reading period can be reduced. In other words, it is possible to prevent misreading of a stored value of a memory cell transistor connected to the select bit line without supplying the non-select bit lines with current during reading period.

In addition, since the semiconductor memory device according to the first preferred embodiment comprises k memory banks, the number of the memory cell transistors which are connected to one bit line is reduced to 1/k in comparison with the conventional configuration. Accordingly, junction capacitance between gates and drains of memory cell transistors and bit lines can greatly be reduced. A precharge period can also be shortened since load capacitance is reduced, thereby making it possible to realize a reduction of current consumption and a high speed operation. Furthermore, a period of a bit line voltage falling down after a precharge is shortened, thereby enabling to shorten a reading period of bit lines and resulting in a high speed operation.

In addition, the input signal S3 is commonly inputted to both the bank selector circuits and the pull-down circuits.

For this reason, firstly, all the bit lines can be set to the GND level by setting the input signal S3 to the active level in the every initial state in the normal read cycle. Therefore, only a normal operation can enable all the bit lines to the GND level in the initial state without doing any special initial operation which is different from a normal operation.

Secondly, all the bit lines including select bit lines can be set to the GND level by setting the input signal S3 to the active level after the lapse of the read cycle. Accordingly, leak currents do not flow in a memory cell array at a stand-by time. Therefore, it is possible to reduce stand-by current.

Configuration of Second Preferred Embodiment

Figure 6:
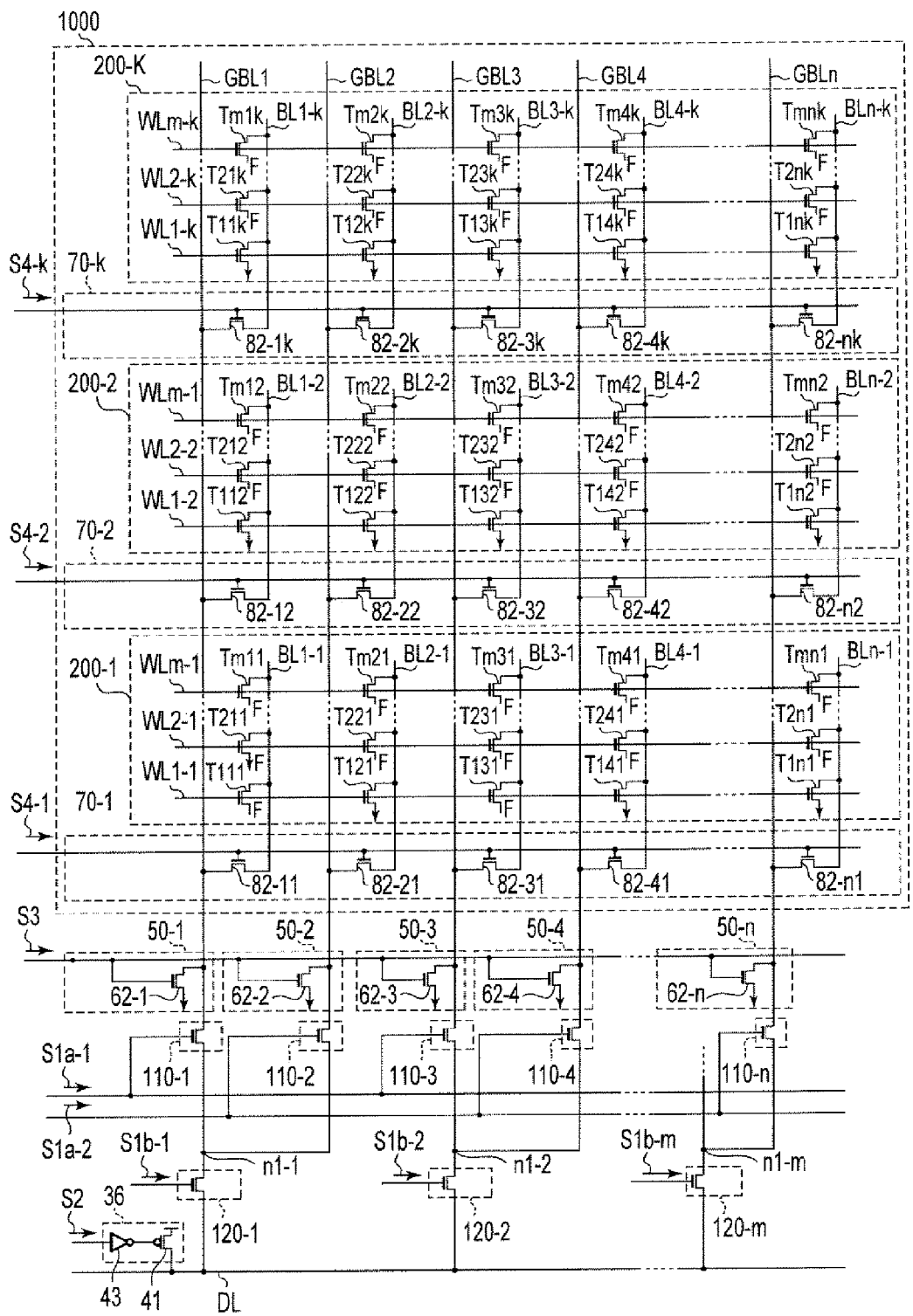
FIG. 6 is a circuit diagram schematically showing the configuration of a mask ROM, which is a semiconductor memory device according to a second preferred embodiment of the present invention.

FIG. 6 is a circuit diagram schematically showing the configuration of a mask ROM, which is a semiconductor memory device according to a second preferred embodiment of the present invention.

A circuit configuration of the second preferred embodiment is different from the first preferred embodiment in that pull-down circuits 150-1 to 150-k are connected to the respective bit lines BL1-1 to BLn-k, and are not connected to the respective global bit lines GBL1 to GBLn. Other configurations are the same as the first preferred embodiment.

Each of the pull-down circuits 150-1 to 150-k is installed in respective memory banks. Each of the pull-down circuits 150-1 to 150-k comprises nMOSs 162-11 to 162-n1 which is connected to the respective bit lines BL1-1 to BLn-k. The input signal S3 is commonly connected to gates of the nMOS 162-11 to 162-n1. Sources of the nMOSs 162-11 to 162-n1 are grounded. Drains of the nMOSs 162-11 to 162-n1 are connected to the respective bit lines BL1-1 to BLn-k.

Operations of the respective control signals are the same as that of the first preferred embodiment shown in FIG. 4.

Operation of each part except for the pull-down circuits 150-1 to 150-k is the same as that of the first preferred embodiment.

In the initial state of the read cycle, all the pull-down circuits 150-1 to 150-k operate since the input signal S3 is set to the active level. As a result, all the bit lines BL1-1 to BLn-k are maintained to the GND level.

At the time t2, since the bank selector signal S4-1 is set to the select level, the global bit line GBL1 and the select bit lines BL1-1 to BLn-1 are electrically connected. As a result, the global bit line GBL1 becomes the GND level.

As stated above, according to the semiconductor memory device of the second preferred embodiment, the pull-down control signal (input signal S3) can be directly inputted to the pull-down circuit without installing logic circuits such as OR circuits in addition to the effect of the first preferred embodiment.

Incidentally, the number of the pull-down circuits increases because each of the pull-down circuits is installed in the respective bit lines. However, it is easy to install the pull-down circuits in the memory cell array since each of the memory cell and the pull-down circuit consists of one transistor.

Configuration of Third Preferred Embodiment

Figure 7:
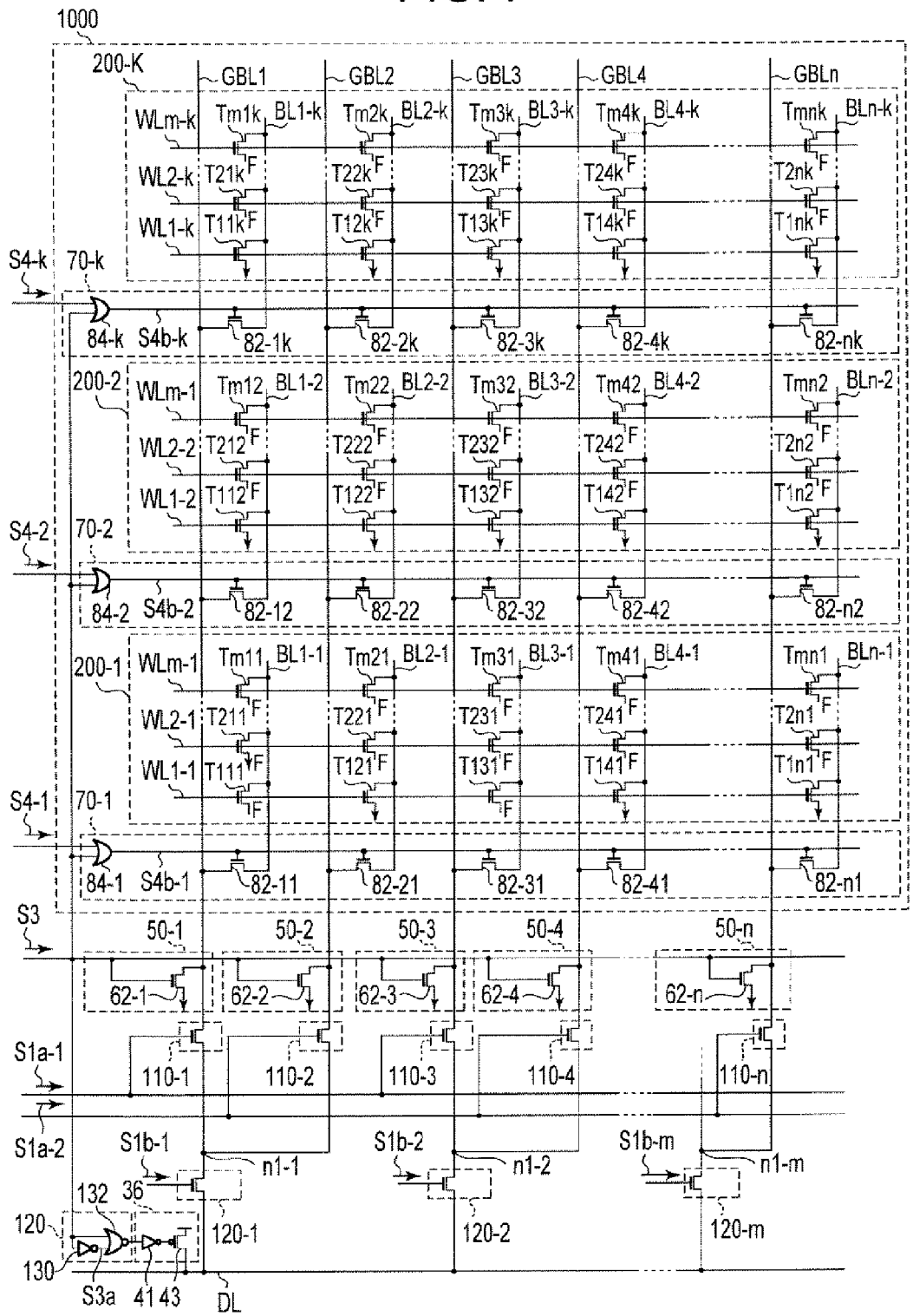
FIG. 7 is a circuit diagram schematically showing the configuration of a mask ROM, which is a semiconductor memory device according to a third preferred embodiment of the present invention.

FIG. 7 is a circuit diagram schematically showing the configuration of a mask ROM, which is a semiconductor memory device according to a third preferred embodiment of the present invention.

A circuit configuration of the third preferred embodiment is different from the first preferred embodiment in that a precharge pulse generating circuit 120 is connected to the precharge circuit 36, that the input signal S3 is inputted to the precharge pulse generating circuit 120, and that an output S3b of the the precharge pulse generating circuit 120 is inputted to the precharge circuit 36. Other configurations are the same as the first preferred embodiment.

The precharge pulse generating circuit 120 comprises a inverting circuit 130 and a NOR circuit 132. A pulse width of the precharge pulse generating circuit 120 can be adjusted by changing the number of stages of the inverting circuit 130 or changing dimensions of transistors of the inverting circuit 130.

Figure 8:
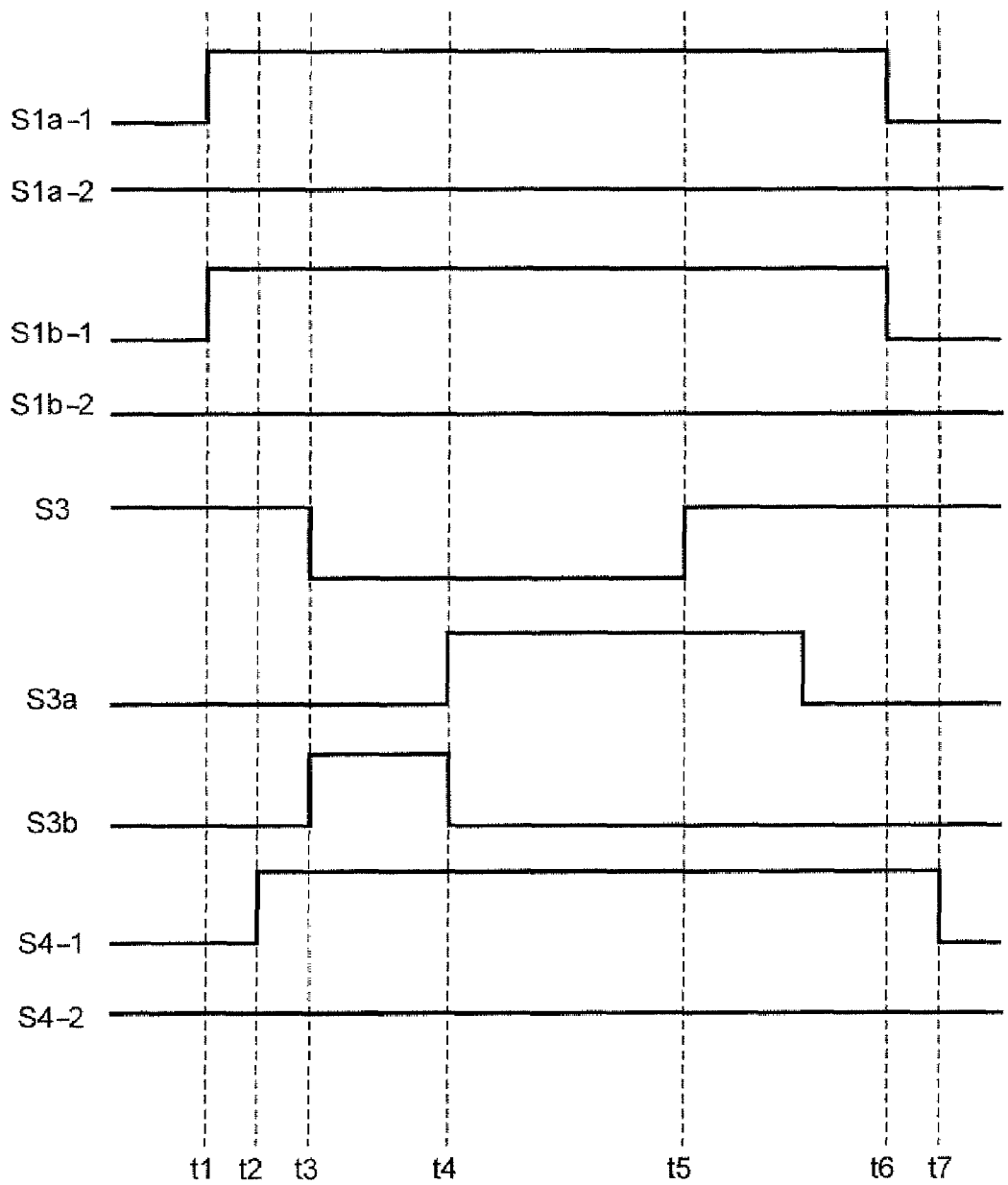
FIG. 8 is a view illustrating the operation of the respective control signal of the semiconductor memory device according to the third preferred embodiment.

FIG. 8 illustrates the operations of the respective control signals S1a-1, S1a-2, S1b-1, S1b-2, S3, S3a, S3b, S4-1 and S4-2, and respective internal signals S3a and S3b according to the third preferred embodiment.

At a time t3, the input signal S3 changes from the active level to the inactive level. As a result, the pull-down circuits 50-1 to 50-n which are connected to the respective global bit lines GBL1 to GBLn are turned off. On the other hand, the internal signal S3b changes from the GND level to the VDD level since the internal signal S3a remains the GND level for a certain period of time. At the time t4, after the certain period of time, the internal signal S3b changes from the VDD level to the GND level since the internal signal S3a changes from the GND level to the VDD level. The precharge circuit 36 is turned on at the time t3 since the internal signal S3b changes to the VDD level, and is turned off at the time t4.

As stated above, according to the semiconductor memory device of the third preferred embodiment, change from the pull-down operation to the precharge operation is controlled by the same signal. Accordingly, an independent input signal for the precharge circuit, such as the input signal S2 in the first and second preferred embodiment, comes to be not necessary.

Further, the precharge period (from the time t3 to the time t4) comes to be able to be adjusted by tuning the dimension of the precharge pulse generating circuit 120.

What is claimed is:

1. A semiconductor memory device comprising:
a plurality of memory banks including a plurality of memory cell transistors respectively, each of the memory cell transistors having a first main electrode, a second main electrode and a control electrode, each of the memory cell transistors being written with a stored value depending on whether a connection is made between the first main electrode thereof and a first voltage line;
a plurality of word lines connected to the control electrodes of the memory cell transistors respectively;
a plurality of bit lines connected to the second main electrodes of the memory cell transistors in the memory bank respectively;
a plurality of global bit lines connected to the bit lines in the memory banks;
a plurality of bank selector circuits, each of the bank selector circuits being provided for the memory banks respectively, each of the bank selector circuits being adapted to receive a bank selector signal having any one of a select level and a non-select level, and each of the bank selector circuits electrically connecting the bit lines in the corresponding memory bank with the global bit lines when the bank selector signal assumes the select level,
at least one pull-down circuit connected to the global bit lines, the pull-down circuit pulling the global bit lines down to the voltage level of the first voltage line when a first input signal, having any one of a first active level and a first inactive level, inputted thereto assumes the first active level;
a data line for selectively outputting voltages of the global bit lines;
a plurality of selector circuits connected between the global bit lines and the data lines, each of the selector circuits electrically connecting the corresponding global bit line with the data line according to a select signal inputted thereto; and
a least one precharge circuit connected to the data line, the precharge circuit precharging the global bit lines to a predetermined voltage level when a second input signal having any one of a second active level and a second inactive level, inputted thereto assumes the second active level, the predetermined voltage level being different from a voltage level of the first voltage line,
wherein the selector circuits comprise a plurality of first selector circuits, a plurality of second selector circuits, and a plurality of third selector circuits;
the first selector circuits being connected between the global bit lines and the third selector circuits, each of the first selector circuits electrically connecting the global bit line with the third selector circuit when a first select signal inputted thereto assumes the select level, and electrically isolating the global bit line from the third selector circuit when the first select signal assumes the non-select level;

the second selector circuits being connected between the global bit lines which is adjacent to the global bit lines connected with the first selector circuits and the third selector circuits, each of the second selector circuits electrically connecting the global bit line with the third selector circuit when a second select signal inputted thereto assumes the selected level, and electrically isolating the global bit line from the third selector circuit when the second select signal assumes the non-select level; and the third selector circuits being connected between both of the first selector circuit and the second selector circuit and the data line, each of the third selector circuits electrically connecting both of the first selector circuit and the second selector circuit with the data line when a third select signal inputted thereto assumes the select level, and electrically isolating both of the first selector circuit and the second selector circuit from the data line when the third select signal assumes the non-select level.

2. The semiconductor memory device as set forth in claim 1, wherein:
each of the global bit lines has one of the pull-down circuits connected thereto.

3. The semiconductor memory device as set forth in claim 1, wherein:
each of the bank selector circuits is adapted to receive the first input signal and the bank selector signal, each of the bank selector circuit electrically connecting the bit lines in the corresponding memory bank with the global bit lines when the first input signal assumes the first active level or the bank selector signal assumes the select level.

4. The semiconductor memory device as set forth in claim 1, wherein the memory cell transistors are arranged in rows and columns.

5. The semiconductor memory device as set forth in claim 4, wherein:
the word lines are respectively connected to the control electrode of the memory cell transistors in the same row; and
the bit lines are respectively connected to the second main electrode of the memory cell transistors in the same column in the memory bank.

* * * * *